United States Patent
Park et al.

(10) Patent No.: US 9,108,451 B2
(45) Date of Patent: Aug. 18, 2015

(54) PHOTORESIST FILM AND MANUFACTURING METHOD FOR ORGANIC LIGHT EMITTING DISPLAY DEVICE USING THE SAME

(71) Applicant: LG Display Co., Ltd., Seoul (KR)

(72) Inventors: Jae hyun Park, Gyeonggi-do (KR); Jin Wuk Kim, Gyeonggi-do (KR); Wy-Yong Kim, Seoul (KR); Hye Li Min, Gyeonggi-do (KR); Min Jee Kim, Seoul (KR); Young tae Son, Gyeonggi-do (KR); Young sub Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 263 days.

(21) Appl. No.: 13/657,988

(22) Filed: Oct. 23, 2012

(65) Prior Publication Data

US 2014/0057379 A1 Feb. 27, 2014

(30) Foreign Application Priority Data

Aug. 27, 2012 (KR) .................. 10-2012-0093762

(51) Int. Cl.
*H01L 21/00* (2006.01)
*B41M 5/46* (2006.01)
*H01L 51/56* (2006.01)
*H01L 51/00* (2006.01)

(52) U.S. Cl.
CPC .............. *B41M 5/46* (2013.01); *B41M 2205/06* (2013.01); *B41M 2205/38* (2013.01); *H01L 51/0013* (2013.01); *H01L 51/56* (2013.01)

(58) Field of Classification Search
USPC ................................ 438/54, 82; 257/E21.242
See application file for complete search history.

(56) References Cited

U.S. PATENT DOCUMENTS

2002/0065366 A1* 5/2002 Wirnsberger et al. .......... 525/88
2009/0047596 A1* 2/2009 Felder et al. .................. 430/200

* cited by examiner

*Primary Examiner* — Julia Slutsker
(74) *Attorney, Agent, or Firm* — Morgan, Lewis & Bockius LLP

(57) ABSTRACT

Disclosed is a photoresist film including a light-to-heat conversion layer on a support film, and a thermo-responsive polymer layer on the light-to-heat conversion layer, wherein the photoresist film is easily detached from a transfer substrate through a temperature adjustment and detach film since the photoresist film includes thermo-responsive polymer.

11 Claims, 2 Drawing Sheets

PHOTORESIST FILM AND MANUFACTURING METHOD FOR ORGANIC LIGHT EMITTING DISPLAY DEVICE USING THE SAME

CROSS-REFERENCE TO RELATED APPLICATIONS

This application claims the benefit of the Korean Patent Application No. 10-2012-0093762 filed on Aug. 27, 2012, which is hereby incorporated by reference in its entirety.

BACKGROUND

1. Field of the Invention

The present invention relates to a photoresist film, and more particularly, a photoresist film and a manufacturing method for an organic light emitting display device using the same.

2. Discussion of the Related Art

An organic light emitting display (OLED) device is one of new flat display devices, and the OLED device can emit light in itself. In comparison with a liquid crystal display (LCD) device, the OLED device has a wider viewing angle and a greater contrast ratio. Furthermore, the OLED device does not require an additional backlight unit, whereby the OLED device can realize thin profile and light weight. Also, the OLED device is advantageous in power consumption. In addition, the OLED device has rapid response speed, and the OLED device can be driven by a low direct-current (DC) voltage, and also be manufactured at a low manufacturing cost.

In order to pattern an emitting layer (EML) between two electrodes on a substrate of the OLED device, a fine metal mask (FMM) method or an inkjet method has been used.

However, it is difficult to apply the FMM method to a large-sized and high-resolution device due to limitations of mask-manufacturing technology. Also, the FMM method may have a problem of sagging mask due to a weight of mask. Since the inkjet method uses a liquid-type material, it might lower functional efficiency of a light-emitting device exposed for a manufacturing process. Especially, in case of methods using a related art etching process, the light-emitting device is brought into direct contact with a solution for etching metal, whereby a disconnection might occur, or device characteristics might be deteriorated.

In order to overcome these problems, a lift-off process has been introduced, which enables a minute pattern even though only exposing and development steps are performed without an etching step during a photo-masking process including exposing, development and etching steps.

However, a dry film resist (DFR) corresponding to a related art photoresist film has a strong adhesive strength. Thus, in a step of removing a photoresist pattern, a residual layer may occur. That is, the residual layer may induce defects in the emitting layer (EML), to thereby lower efficiency of device.

A thermo-responsive polymer is a material showing a reversible phase transition by a rapid solubility difference of polymer according to a temperature change in an aqueous solution.

The thermo-responsive polymer may be largely classified into a material with a lower critical solution temperature (LCST) and a material with an upper critical solution temperature (UCST). The thermo-responsive polymer with the LCST, for example, has hydrophobic properties at a temperature of the LCST or higher than the LCST, whereby a phase separation occurs.

Generally, the thermo-responsive polymer has been used for controlling a drug release in a medical field. In recent years, the thermo-responsive polymer has attracted attentions owing to studies for application in various fields.

SUMMARY

Accordingly, the present invention is directed to a photoresist film and a manufacturing method for an OLED device using the photoresist film that substantially obviates one or more problems due to limitations and disadvantages of the related art.

One aspect of the present invention relates to a manufacturing method for an OLED which facilitates to improve efficiency of display device through the use of photoresist film using thermo-responsive polymer.

Another aspect of the present invention relates to a manufacturing method for an OLED which facilitates to form a pattern with minimum damage through the use of photoresist film using thermo-responsive polymer.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one aspect, to achieve these and other advantages and in accordance with the purpose of the invention, as embodied and broadly described herein, a photoresist film according to some embodiments may comprise a light-to-heat conversion layer on a support film; and a thermo-responsive polymer layer on the light-to-heat conversion layer.

In another aspect of the present invention, a manufacturing method for an OLED device according to some embodiments may comprise forming a photoresist film including a support film, a light-to-heat conversion layer (LTHC), and a thermo-responsive polymer layer on a transfer substrate; exposing the photoresist film; forming a photoresist pattern by irradiating the exposed photoresist film with infrared rays (IR); depositing an emitting layer on the photoresist pattern; and detaching the photoresist pattern from the transfer substrate through a temperature adjustment.

It is to be understood that both the foregoing general description and the following detailed description of the present invention are only exemplary and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

Figure 1:
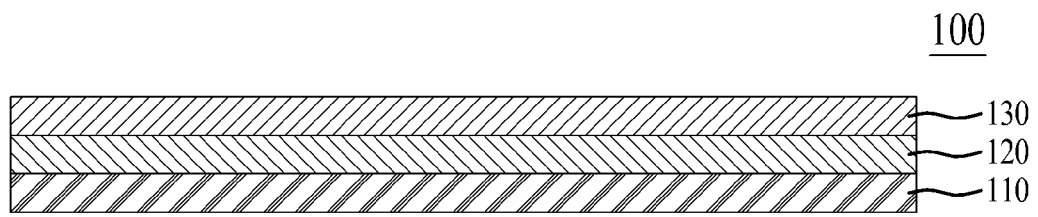
FIG. 1 is a cross sectional view of a photoresist film according to one embodiment of the present invention.

FIG. 1 is a cross sectional view of a photoresist film according to one embodiment of the present invention.

As shown in FIG. 1, the photoresist film 100 according to one embodiment of the present invention includes a support film 110, a light-to-heat conversion layer (LTHC) 120, and a thermo-responsive polymer layer 130 (e.g. PEO-PPO-PEO triblock copolymer).

According to one embodiment of the present invention, the photoresist film 100 may be obtained by forming the LTHC layer 120 on the support film 110, and forming the thermo-responsive polymer layer 130 (e.g. PEO-PPO-PEO triblock copolymer) on the LTHC layer 120.

First, the support film 110 may include a polymer film with good transmittance, for example, polyester (PS), polyethylene terephthalate (PET), polyethylene naphthalate (PEN), and etc. Also, the support film 110 may include a material having good adhesion to the LTHC layer 120, but it is not limited.

Also, the support film 110 may protect and support the LTHC layer 120 and thermo-responsive polymer layer 130.

The LTHC layer 120 may absorb infrared rays of light, and may convert some of the absorbed light into heat. In this case, the LTHC layer 120 may have an appropriate optical density to efficiently absorbed light. The LTHC layer 120 may be formed of a light-absorbing material to absorb the light. For example, the LTHC layer 120 may include a metal film of aluminum (Al), argentum (Ag), or their oxide or sulfide, or may include an organic film of polymer including, but not limited to, carbon black, graphite or infrared-ray dye. In some embodiments, when the LTHC layer absorbs the light and converts some of the absorbed light into heat, such conversion may result in expansion of the LTHC layer. In this case, the LTHC layer 120 of metal film may be formed by a vapor deposition method, an electron-beam evaporation method, or a sputtering method. Meanwhile, the LTHC layer 120 of organic film may be formed of a general film coating method, that is, one of gravure, extrusion, spin or knife coating methods.

The thermo-responsive polymer layer 130 may be formed of thermo-responsive polymer. The thermo-responsive polymer described herein may make a phase separation between water and polymer when a temperature is raised above a predetermined value in a polymer state but are soluble in a low-temperature aqueous solution below the predetermined temperature. The thermo-responsive polymer described herein may also make a phase separation between water and polymer when a temperature is lowered below a predetermined value in a polymer state but are soluble in a high-temperature aqueous solution above the predetermined temperature.

For example, the thermo-responsive polymer may include a polymer having an ether group, including, but not limited to, polyethylene oxide (PEO), polyethylene oxide (PEO)-propylene oxide (PPO) copolymer, PEO-PPO-PEO triblock copolymer, PEO-PLGA-PEO triblock copolymer, or polyvinylmethylether (PVME). In additional embodiments, the thermo-responsive polymer described herein may also include N-isopropyl acrylamide, N-isopropylacrylamide, N-tert-butylacrylamide, N,N'-diethyl acrylamide, dimethylaminoethyl methacrylate, N-(L)-1-hydroxymethyl, and the like. In additional embodiments, the thermo-responsive polymer described herein may also include poly-oligo(ethylene glycol) methyl ether methacrylate (POEGMA), POEGMA-block-poly(N-isopropylacrylamide) (POEGMA-b-PNIPAM), POEGMA-b-poly(N,N-diethylacrylamide) (POEGMA-b-PDEAM), POEGMA-b-[PNIPAM-co-poly (pentafluorophenyl acrylate)] (POEGMA-b-(PNIPAM-co-PPFPA)).

Also, the thermo-responsive polymer may include a polymer having an alcohol group, including, but not limited to, hydroxy propylacrylate, hydroxy propylmethylcellulose, hydroxy propylcellulose, hydroxy ethylcellulose, methylcellulose, polyvinyl alcohol, and etc. the thermo-responsive polymer may include a polymer having an N-substituent amide group, including, but not limited to, poly N-acryloyl pyrrolidine, poly N-acryloyl piperidine, poly acryl-L-amino acid amide, or poly ethyl oxazoline.

In some embodiments, the LCST of the copolymer described herein (e.g. PEO-PPO-PEO triblock copolymer) may be adjusted by adjusting degree of polymerization in the hydrophilic part (e.g. PEO) and the hydrophobic part (e.g. PPO).

Also, the copolymer described herein may be classified according to the number of its monomers. For example, the PEO-PPO-PEO triblock copolymer may be classified according to the number of PEO and PPO, that is, F38, F68, F77, F77, F98, F108, and F127 spelt with 'F'; L31, L42, L43, L44, L62, L72, and L101 spelt with 'L'; and P75, P103, and P104 spelt with 'P', wherein the above examples of PEO-PPO-PEO triblock copolymer have the PEO-PPO-PEO structure, however, their compositions and types are slightly different from one another.

For example, the material having the LCST above 100° C. may include $EO_{100}PO_{65}EO_{100}$, $EO_{132}PO_{50}EO_{132}$, $EO_{76}PO_{29}EO_{76}$ or $EO_{103}PO_{39}EO_{103}$; and the material having the LCST above 80° C. may include $EO_{17}PO_{60}EO_{17}$, $EO_{27}PO_{61}EO_{27}$ or $EO_{37}PO_{56}EO_{37}$.

However, the kind of thermo-responsive polymers for the thermo-responsive polymer layer 130 of the present invention is not limited to the above examples. That is, the thermo-responsive polymer layer 130 of the present invention may be formed through the use of various thermo-responsive polymers.

The thermo-responsive polymer layer 130 may be obtained by spraying or coating the thermo-responsive polymer onto the LTHC layer 120 through the use of any one of air knife, roll coater, spray, dipping coater, gravure coater, spin coater, bar coater, doctor blade, and slit coater. The thermo-responsive polymer layer 130 may have a thickness from 0.5 to 25.0 μm, from 1.0 to 20.0 μm, from 5.0 to 15.0 μm, from 10.0 to 15.0 μm, or from 5.0 to 10.0 μm.

In addition to the above structure, various kinds of additive may further be included in the photoresist film 100. For example, a photo initiator or photo acid generator may be included in the photoresist film 100, or an additive (e.g. binder or monomer including the binder) may be included in the photoresist film 100 (e.g. in the thermo-responsive layer, LTHC layer, or support film).

In this case, the binder may be included in the ingredients of LTHC layer 120, wherein the binder transfers a transferring material in the LTHC layer 120 when the photoresist film 100 is irradiated with the light. For example, the binder may include acrylate polymers (e.g. novolac resin, polyester acrylate, epoxy acrylate, or urethane acrylate). Suitable alkyl acrylates for use in preparing the polymeric binders of some embodiments include methyl acrylate, ethyl acrylate, propyl acrylate, butyl acrylate, methyl methacrylate, ethyl methacrylate, butyl methacrylate, etc. Suitable α,β-ethylenically unsaturated carboxylic acids include acrylic acid, methacrylic acid, crotonic acid, maleic acid or anhydride and the like. The polymeric binders of some embodiments can be prepared by any of the addition polymerization techniques known to those skilled in the art, which include solution polymerization, bulk polymerization, bead polymerization, emulsion polymerization, etc., in the presence of a free radical generating polymerization initiator (e.g. peroxy compounds, e.g., benzoyl peroxide, di(tertiary amyl)peroxide, or diisopropylperoxy carbonate, azo initiators, e.g., 1,1'-azodicyclohexanecarbonitrile, 2,2'-azobis(2-methylpropionitrile)).

Also, the photo initiator may be included in the ingredients of LTHC layer 120, wherein the photo initiator enhances the hardness of photoresist film 100 by curing the binder for the irradiation of light. For example, the photo initiator may include acetophenone, oxime, aromatic ketones (benzophenone, N,N'-tetramethyl-4,4'-diaminobenzophenone (Michler's ketone), N,N'-tetramethyl-4,4'-diaminobenzophenone, 4-methoxy-4'-dimethylaminobenzophenone, 2-ethylanthraquinone, phenanthrenequinone, etc.), benzoins (benzoin ethers such as benzoin methyl ether, benzoin ethyl ether and benzoin phenyl ether, methylbenzoin, ethylbenzoin, etc.), benzyl derivatives (benzyl dimethyl ketal, etc.), 2,4,5-triarylimidazole dimers (e.g. 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.), and acridine derivatives (9-phenylacridine, 1,7-bis(9,9'-acridinyl)heptane, etc.). The photo initiator, for example, may also include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85.degree. C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. These photo initiators may be used singly or in combination of two or more of them. The kind or content of photo initiator may be appropriately determined based on a desired pattern and a wavelength range of exposing process.

Also, the photo acid generator may be included in the ingredients of LTHC layer 120, wherein the photo acid generator generates acid for the irradiation of light. For example, the photo acid generator may include triarylsulfonium salts, diaryliodonium salts, sulfonates, or their alloys. In some embodiments, the photo acid generator may include triphenylsulfonium triflate, N-hydroxysuccinimide, or mixtures thereof Accordingly, the photoresist film 100 according to one embodiment of the present invention may be positioned on a predetermined transfer substrate to be formed with the desired pattern. In this case, the transfer substrate may be positioned in such a manner that the upper surface of transfer substrate is brought into contact with the thermo-responsive polymer layer 130. Accordingly, the photoresist film 100 according to one embodiment of the present invention may be transferred to the transfer substrate, to thereby form the pattern.

The following Table 1 shows results of detachment rate and retention rate of the emitting layer (EML) for the photoresist film 100 according to one embodiment of the present invention. Also, the embodiments 1 and 2 show results of detachment rate and retention rate of the emitting layer (EML) according to a thickness of thermo-responsive polymer.

COMPARATIVE EXAMPLE

A related art dry film resist (DFR) is formed on a transfer substrate, and then detachment rate and retention rate of the emitting layer (EML) for the dry film resist (DFR) are evaluated.

That is, after depositing the emitting layer (EML), a temperature is maintained at 120° C. for 5 minutes, and then the dry film resist (DFR) is removed to evaluate the detachment rate and the retention rate of emitting layer (EML).

According to the evaluation results, the detachment rate is 3%, and the retention rate of emitting layer (EML) is 4%.

Herein, the detachment rate is calculated by 'a removed area of dry film resist (DFR)/an entire area of dry film resist (DFR)'; and the retention rate of emitting layer (EML) is calculated by 'an area of emitting layer (EML) remained on the transfer substrate/an entire area of emitting layer (EML) deposited on the transfer substrate'.

EXAMPLE 1

A photoresist film coated with F127 ($EO_{100}PO_{65}EO_{100}$) was formed on a transfer substrate, and then detachment rate and retention rate of emitting layer (EML) for the photoresist film were evaluated.

At this time, the photoresist film was coated with F127 of thermo-responsive polymer through the use of bar coater method, and a thickness of PEO-PPO-PEO (F127) coated onto the photoresist film was 6 μm.

After depositing the emitting layer (EML), a temperature was maintained at 120° C. for 5 minutes, and then the photoresist film was removed to evaluate the detachment rate and the retention rate of emitting layer (EML).

According to the evaluation results, the detachment rate was 58%, and the retention rate of emitting layer (EML) was 65%, wherein the detachment rate and retention rate of emitting layer (EML) were calculated by the same method mentioned in the comparative example.

EXAMPLE 2

A photoresist film coated with F127 ($EO_{100}PO_{65}EO_{100}$) was formed on a transfer substrate, and then detachment rate and retention rate of emitting layer (EML) for the photoresist film were evaluated.

At this time, the photoresist film was coated with F127 of thermo-responsive polymer through the use of bar coater method, and a thickness of PEO-PPO-PEO (F127) coated onto the photoresist film was 16 µm.

After depositing the emitting layer (EML), a temperature was maintained at 120° C. for 5 minutes, and then the photoresist film was removed to evaluate the detachment rate and the retention rate of emitting layer (EML).

According to the evaluation results, the detachment rate was 72%, and the retention rate of emitting layer (EML) was 83%, wherein the detachment rate and retention rate of emitting layer (EML) were calculated by the same method mentioned in the comparative example.

As shown in the following Table 1, the detachment rate and retention rate of emitting layer (EML) in the embodiments 1 and 2 using the photoresist film including the thermo-responsive polymer were higher than those of the comparative example.

TABLE 1

|  | composition | Thickness of photo-responsive polymer (µm) | Detachment rate (%) | Retention rate of emitting layer (%) |
| --- | --- | --- | --- | --- |
| Comparative example | Dry film resist (DFR) | 0 | 3 | 4 |
| EXAMPLE 1 | Photoresist film including F127 | 6 | 58 | 65 |
| EXAMPLE 2 | Photoresist film including F127 | 16 | 72 | 83 |

Hereinafter, a manufacturing method for an OLED device using the photoresist film according to one embodiment of the present invention is described below.

FIGS. 2 to 6 are cross sectional views of a manufacturing method for an OLED device using the photoresist film according to one embodiment of the present invention.

Figure 2:
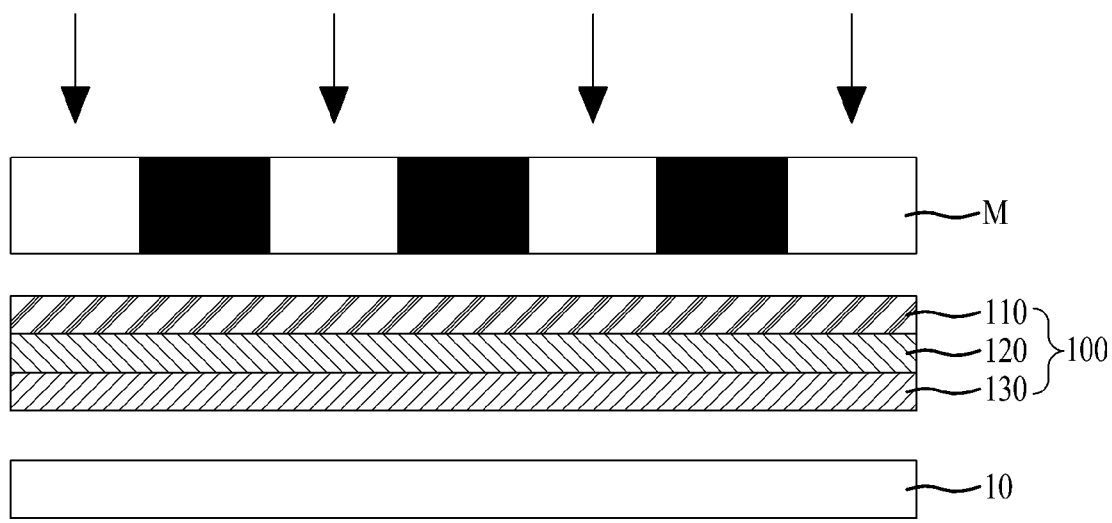
FIGS. 2 to 6 are cross sectional views of a manufacturing method for an OLED device using the photoresist film according to one embodiment of the present invention.
Figure 3:
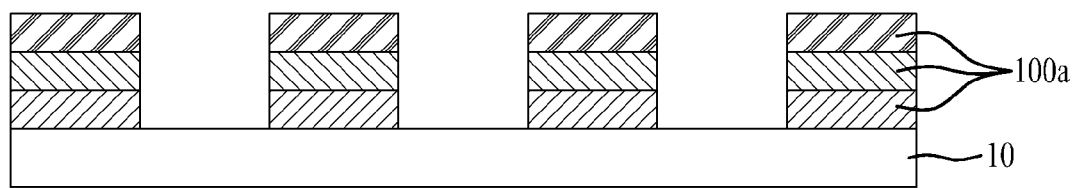

First, as shown in FIGS. 2 and 3, the photoresist film 100 including the support film 110, light-to-heat conversion layer (LTHC) 120 and thermo-responsive polymer layer 130 of PEO-PPO-PEO triblock copolymer was formed on the transfer substrate 10. Thereafter, the photoresist film 100 including the support film 110, light-to-heat conversion layer (LTHC) 120 and thermo-responsive polymer layer 130 of PEO-PPO-PEO triblock copolymer was exposed, and then the exposed photoresist film 100 positioned on the transfer substrate 10 was irradiated with infrared rays (IR), to thereby form a photoresist pattern 100a.

FIG. 2 shows the exposing process of the photoresist film 100 including the thermo-responsive polymer layer 130. FIG. 3 shows the photoresist pattern 100a on the transfer substrate 10.

That is, the exposing process may be carried out by irradiating the photoresist film 100 on the transfer substrate 10 with infrared rays (IR) through the use of mask (M) having a predetermined pattern, to thereby form the photoresist pattern 100a.

First, the transfer substrate 10 may be formed of a material with transparency and good thermal resistance (e.g. glass), plastic, or metal. For example, the transfer substrate 10 may be formed of a substrate having a light transmittance above 80%.

The transfer substrate 10 may comprise a single film or multiple films selected from a group including a hole injection layer, a hole transport layer, an organic light-emitting layer, a hole blocking layer, an electron transport layer, and an electron injection layer.

Also, the IR irradiation may be designed to have constant energy density, wavelength and irradiation time. In some embodiments, the IR irradiation may be adjusted to have energy density or irradiation time in a wavelength range above about 800 nm, 900 nm, 1000 nm, 1100 nm, or 1200 nm. Here, the intensity of radiation is evaluated using an IR laser with a range of approximately 0.1-10.2 W, and a speed of scanning has a range of approximately 0.28-85 mm/s In this case, energy may be adjusted within a range of approximately 2.78-5666.67 mJ/cm$^2$.

Although not shown, the OLED device may include a first electrode, an organic light-emitting layer, and a second electrode. The organic light-emitting layer may include the hole injection layer (HIL), hole transport layer (HTL), emitting layer (EML), and electron transport layer (ETL).

That is, the OLED device may include the substrate, the first electrode on the substrate; the hole injection layer (HIL) on the first electrode, the hole transport layer (HTL) on the hole injection layer (HIL), the emitting layer on the hole transport layer (HTL), the electron transport layer (ETL) on the emitting layer, the electron injection layer on the electron transport layer (ETL), and the second electrode on the electron injection layer.

At this time, the hole transport layer (HTL) transports a hole to the emitting layer (EML), and prevents an electron generated by a cathode electrode from being drifted to an light-emitting area, to thereby improve light-emitting efficiency.

For example, the hole transport layer (HTL) may be formed of arylene diamine derivative, starburst type compound, or bipheny diamine derivative having a spiro group, and trapezoidal compound. In more detail, the hole transport layer (HTL) may be N,N-diphenyl-N,N'-bis(4-methylphenyl)-1,1'-biphenyl-4,4'-diamine (TPD) or 4,4'-bis[N-(1-napril)-N-phenylamino]biphenyl (NPB).

Also, the emitting layer (EML) may be a mixed layer of hole transport material and electron transport material, and the emitting layer (EML) may be formed on the hole transport layer (HTL).

In order to form the emitting layer (EML) of the OLED device, the photoresist film 100 is formed on the hole transport layer (HTL), and the photoresist film 100 on the hole transport layer (HTL) may be irradiated with infrared rays (IR) through the use of mask (M) having the predetermined pattern, to thereby form the photoresist pattern 100a.

In this case, the photoresist film 100 may be formed to bring the thermo-responsive polymer layer 130 into contact with the hole transport layer (HTL). That is, the photoresist film 100 with the thermo-responsive polymer layer 130, light-to-heat conversion layer 120, and support film 110 sequentially formed therein may be positioned on the hole transport layer (HTL), whereby the photoresist pattern 100a is easily detached from the hole transport layer (HTL).

Figure 4:
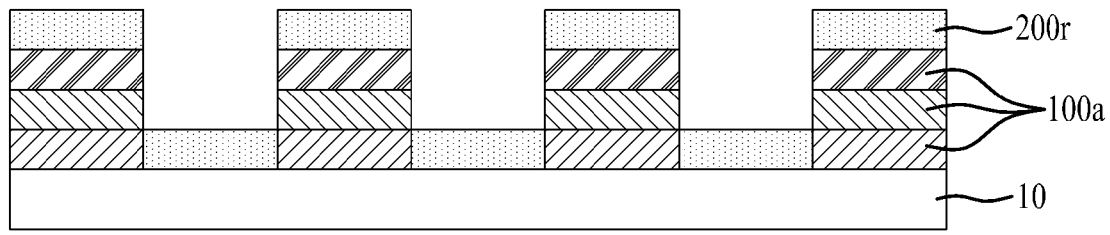

Then, as shown in FIG. 4, the emitting layer (EML) 200r may be deposited on the photoresist pattern 100a.

Generally, the emitting layer (EML) may be used to represent red, green and blue colors. For this, organic materials for emitting red, green and blue colored light may be patterned in respective pixels. For example, the organic material for emitting the red color light may be low molecular weight substances, such as Alq3(host)/DCJTB(fluorescent dopant), Alq3(host)/DCM(fluorescent dopant) and CBP(host)/PtOEP (phosphorescent organic metal complex), and high molecular weight substances, such as PFO-based polymer and PPV-based polymer; the organic material for emitting the green color light may be low molecular weight substances, such as Alq3, Alq3(host)/C545t(dopant) and CBP(host)/IrPPY (phosphorescent organic metal complex), and high molecular weight substances, such as PFO-based polymer and PPV-based polymer; and the organic material for emitting the blue color light may be low molecular weight substances, such as DPVBi, spiro-DPVBi, spiro-6P, distilbenzene (DSB) and distyryl aryine (DSA (DSA), and high molecular weight substances, such as PFO-based polymer and PPV-based polymer.

For example, the organic material may be coated or sprayed onto the upper surface of the photoresist pattern 100a on the transfer substrate 10, whereby the emitting layer 200r is separately formed in each pixel region (P).

FIG. 4 shows only red-colored light emitting layer 200r. As the organic materials for emitting the red, green, and blue colored light are respectively deposited in the pixels through the use of mask (M), it is possible to form the red, green and blue colored light emitting layers for the respective pixel regions.

On application of the photoresist film 100 according to one embodiment of the present invention, a laser induced thermal imaging method may be used to pattern the emitting layer (EML). However, it is not limited to the laser induced thermal imaging method. That is, it is possible to apply various patterning methods.

Figure 5:
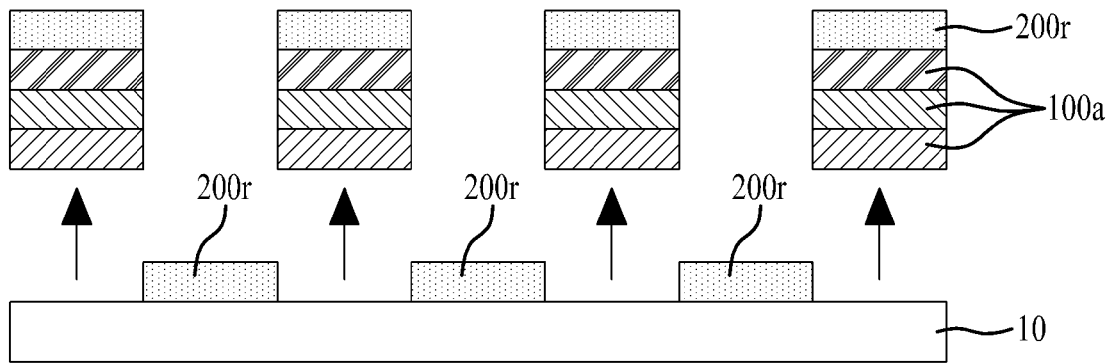
Figure 6:
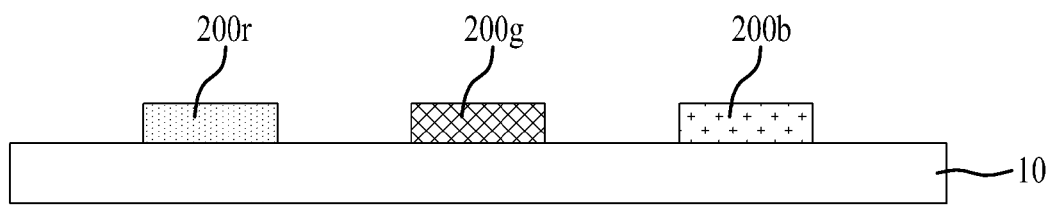

As shown in FIGS. 5 and 6, the photoresist pattern 100a is detached from the transfer substrate 10 through the temperature adjustment, whereby the emitting layers 200r, 200g and 200b are formed on the transfer substrate 10.

In this case, the temperature may be adjusted to change the thermo-responsive polymer layer 130 of the photoresist film 100.

As the thermo-responsive polymer layer 130 has the structure of PEO-PPO-PEO, the temperature may be adjusted to satisfy the LCST corresponding to the characteristics of the respective materials. For example, in case of $EO_{100}PO_{65}EO_{100}$, $EO_{132}PO_{50}EO_{132}$, $EO_{76}PO_{29}EO_{76}$ or $EO_{103}PO_{39}EO_{103}$, the temperature is raised to 100° C. or higher than 100° C. In case of $EO_{17}PO_{60}EO_{17}$, $EO_{27}PO_{61}EO_{27}$ or $EO_{37}PO_{56}EO_{37}$, the temperature is raised to 80° C. or higher than 80° C.

Through the temperature adjustment, it is possible to lower an adhesive strength between the transfer substrate 10 and the photoresist pattern 100a.

Then, the photoresist pattern 100a is detached from the transfer substrate 10. According to the present invention, the photoresist pattern 100a may be easily detached from the transfer substrate 10 through the use of detach film. The detach film is a film whose adhesive strength is similar to that of a generally-used tape. However, it is not limited to the above, that is, size or type of the detach film can be diversely adjusted and used.

After adhering the detach film onto the support film 110 of the photoresist pattern 100a, the photoresist pattern 100a may be easily detached from the transfer substrate 10.

As shown in FIG. 6, the emitting layers 200r, 200g and 200g may be formed on the transfer substrate 10.

Accordingly, the photoresist film 100 according to one embodiment of the present invention may facilitate to provide the OLED device having the desired pattern with the minimum damage, and facilitate to manufacture the display device with great light-emitting efficiency and long lifespan, and simultaneously to improve the yield.

For the above description, it shows an example that the photoresist film 100 according to one embodiment of the present invention is applied to the OLED device, but not necessarily. Thus, the photoresist film 100 according to one embodiment of the present invention may be applied to various kinds of display device, for example, liquid crystal display (LCD) device or electrophoresis display (EPD) device.

In one aspect of the present invention, it is possible to improve the light-emitting efficiency of display device, and to increase the lifespan of display device through the use of photoresist film 100 including the thermo-responsive polymer, to thereby improve the yield.

For forming the desired pattern, the photoresist film 100 may be easily detached from the transfer substrate 10 through the temperature adjustment and detach film, whereby it facilitates to provide the OLED device having the desired pattern with the minimum damage on the emitting layer (EML).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A manufacturing method for an OLED device comprising:
    forming a photoresist film including a support film, a light-to-heat conversion layer (LTHC), and a thermo-responsive polymer layer on a transfer substrate;
    forming a photoresist pattern by irradiating the photoresist film with infrared rays (IR) and removing irradiated portions of the photoresist film so that an upper portion of the transfer substrate is exposed;
    depositing an emitting layer on the photoresist pattern and the exposed upper surface of the transfer substrate; and
    detaching the photoresist pattern from the transfer substrate through a temperature adjustment such that portions of the emitting layer remain on the exposed upper surface of the transfer substrate.

2. The method according to claim 1, wherein the thermo-responsive polymer layer comprises a polymer having an ether group, a polymer having an alcohol group, or a polymer having an N-substitution amide group.

3. The method according to claim 1, wherein the light-to-heat conversion layer is formed by a vapor deposition method, an electron-beam evaporation method, or a sputtering method.

4. The method according to claim 1, wherein the light-to-heat conversion layer comprises a metal film, an organic film of polymer, or a mixture thereof.

5. The method according to claim 4, wherein the metal film comprises aluminum (Al), argentum (Ag), or their oxide or sulfide, and the organic film of polymer comprises carbon black, graphite or infrared-ray dye.

6. The photoresist film according to claim 2, wherein the polymer having an ether group is selected from the group consisting of polyethylene oxide (PEO), polyethylene oxide (PEO)-propylene oxide (PPO) copolymer, PEO-PPO-PEO triblock copolymer, PEO-PLGA-PEO triblock copolymer, and polyvinylmethylether (PVME),
    the polymer having an alcohol group is selected from the group consisting of hydroxy propylacrylate, hydroxy propylmethylcellulose, hydroxy propylcellulose, hydroxy ethylcellulose, methylcellulose, polyvinyl alcohol, and
    the polymer having an N-substitution amide group is selected from the group consisting of poly N-acryloyl pyrrolidine, poly N-acryloyl piperidine, poly acryl-L-amino acid amide, or poly ethyl oxazoline.

7. The photoresist film according to claim 1, wherein the thermo-responsive polymer layer comprises PEO-PPO-PEO triblock copolymer.

8. The photoresist film according to claim 1, wherein the thermo-responsive polymer layer comprises $EO_{100}PO_{65}EO_{100}$, $EO_{132}PO_{50}EO_{132}$, $EO_{76}PO_{29}EO_{76}$, $EO_{103}PO_{39}EO_{103}$, $EO_{17}PO_{60}EO_{17}$, $EO_{27}PO_{61}EO_{27}$ or $EO_{37}PO_{56}EO_{37}$.

9. The photoresist film according to claim 1, wherein the light-to-heat conversion layer comprises a binder, a monomer including a binder, a photo initiator, a photo acid generator, or a mixture thereof.

10. The method according to claim 1, wherein the irradiating the exposed photoresist film with IR comprises adjusting at least one of an energy density and an irradiation time in a wavelength above about 1000 nm.

11. The method according to claim 1, wherein the exposed upper surface of the transfer substrate is an upper surface of one of a hole injection layer, a hole transport layer, an organic light-emitting layer, a hole blocking layer, an electron transport layer, and an electron injection layer.

* * * * *